United States Patent [19]

Wood et al.

[11] Patent Number: 4,823,315

[45] Date of Patent: Apr. 18, 1989

[54] PLURAL EMITTER MEMORY WITH VOLTAGE CLAMPING PLURAL EMITTER TRANSISTOR

[75] Inventors: Ian C. Wood; David G. Taylor, Both of Northampton, England

[73] Assignee: Plessey Overseas Limited, Ilford, England

[21] Appl. No.: 51,450

[22] Filed: May 18, 1987

[51] Int. Cl.⁴ ............................................. G11C 11/40
[52] U.S. Cl. ..................................... 365/155; 365/179
[58] Field of Search ................. 365/154, 155, 177, 179

[56] References Cited

U.S. PATENT DOCUMENTS 3,745,540 7/1973 Taniguchi et al. ................... 365/154
3,821,719 6/1974 Taniguchi et al. ................... 365/155

*Primary Examiner*—James W. Moffitt
*Attorney, Agent, or Firm*—Michael F. Oglo; Julian C. Renfro

[57] ABSTRACT

A transistor memory cell device comprising a pair of cross-coupled transistors constituting storage elements for storing binary information and having column drive emitter inputs to which a relatively high column drive current is applied for the selective read or write operation of storage elements of the cell device. A constant current source provides a relatively low value hold current to maintain the binary digit information stored in the storage elements in the absence of column drive current. A voltage clamping dual emitter transistor has the emitters thereof connected directly to the respective base-collector interconnections of the cross-coupled transistors, with the base of the clamping transistor having applied to it an offset voltage higher than a voltage applied to a non select line connected to the collector circuits of the cross-coupled transistors. This provides a cell device in which the possible forward bias of the cross-coupled transistor pair base-collector junction is small enough to avoid saturation.

1 Claim, 1 Drawing Sheet

PLURAL EMITTER MEMORY WITH VOLTAGE CLAMPING PLURAL EMITTER TRANSISTOR

BACKGROUND OF THE INVENTION

This invention relates to solid-state memory cell devices and relates more specifically to transistor memory cell devices of the kind commonly used in fast emitter coupled logic random access memories and comprising a pair of cross-coupled preferably dual-emitter transistors constituting storage elements for storing binary digit information. For the selection of the storage elements of the memory cell device for a read or write operation a relatively high current is applied to one of two so-called column drive emitter inputs to the cross-coupled transistors. However, when the memory cell device is in the unselected state (ie. in the absence of the column drive current) relatively low value hold current from a constant current source maintains the binary digit information stored in the transistor storage elements. Hitherto, for the purpose of preventing saturation of the cross-coupled transistors of the memory cell device and the consequential disturbance of the precise d.c. voltage levels required to drive the memory cell device and worsening of the speed performance of the memory cell device, a pair of Schottky diodes are connected to the respective base-collector interconnections of the cross-coupled transistors. In this way the Schottky diodes clamp the voltage on the transistor interconnections just referred to relative to the voltage on the so-called row select line of the memory cell device connected in common to the cell transistor collectors, the forward voltage of each Schottky diode is being less than the base-collector forward voltage required to cause the aforementioned undesirable saturation of the cell transistors.

SUMMARY OF THE INVENTION

According to the present invention there is provided a transistor memory cell device of the kind described in which voltage clamping transistor means is connected to the base-collector interconnections of the pair of cross-coupled transistors, with the base means of the clamping transistor means having applied to it an offset voltage higher than the voltage applied to a row select line connected to the collector circuits of the cross-coupled transistors whereby the possible forward bias of the cross-coupled transistor pair base-collector junction is small enough to avoid saturation.

The voltage clamping transistor means may comprise a dual-emitter transistor having its emitters connected respectively to the base-collector cross connections of the transistor pair.

The memory cell device according to the present invention enables the use of Schottky diodes which require extra process development and process steps than transistors to be avoided. Moreover, the Schottky diodes in the known memory cell device described must have a low series resistance in order to achieve a sufficiently low forward voltage drop (i.e. lower than the base-collector forward voltage of the cross-coupled transistors required to cause saturation) if saturation of the cross-coupled transistors is to be avoided. Consequently, the diodes must be significantly larger than the clamping transistors used in the memory cell device of the present invention. Other advantages of the clamping transistors over the Schottky diodes are mentioned in the following description of an embodiment of the present invention.

By way of example the present invention will now be described with reference to the accompanying drawings.

DESCRIPTION OF THE PRIOR ART

Figure 1:
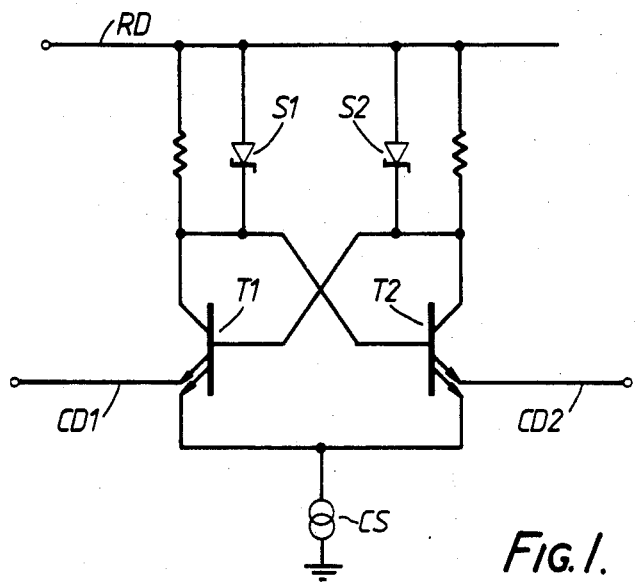
FIG. 1 shows a known form of memory cell device.

Referring to FIG. 1 of the drawings, the memory cell device illustrated comprises a pair of cross-coupled dual-emitter transistors T1 and T2 having their respective bases cross-coupled to the collector of the other transistor of the pair.

The transistors T1 and T2 constitute binary digit storage elements and for the selection of a storage element for a read or write operation a relatively high current is caused to flow through one of the column drive emitter inputs CD1 and CD2. In the unselected state of the transistor cell device the stored information in the storage element transistors is maintained by a relatively low hold current derived from a constant current source CS connected to the interconnected emitters of the transistors T1 and T2. In order to prevent the possibility of saturation of one of the storage transistors T1 and T2 which would not only disturb precise d.c. voltage levels required for driving the memory cell device but would also impair the speed of operation of the cell device a pair of clamping Schottky diodes S1 and S2 are provided. These diodes clamp the voltages on the transistor base-collector connections relative to the common row select line RD thereby ensuring that the forward voltage of the Schottky diodes is less than the base-collector voltage required to cause saturation of one of the transistors T1 and T2.

DESCRIPTION OF A PREFERRED EMBODIMENT

Figure 2:
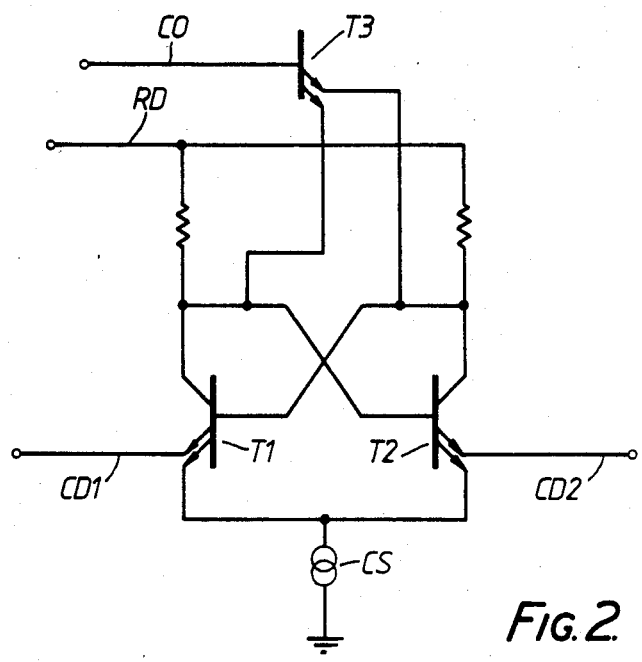
FIG. 2 shows a memory cell device according to the present invention.

Referring now to FIG. 2 of the drawings, this shows an arrangement of memory cell device which avoids the use of Schottky diodes which have the previously mentioned disadvantages.

The memory cell device shown utilises a dual-emitter voltage clamping transistor T3 instead of the Schottky diodes in the FIG. 1 arrangement. In this cell device the base of the voltage clamping transistor T3 has applied to it over the line CO a clamp offset voltage which is higher than the voltage applied to the common row select line RD. The offset voltage is chosen such that the possible forward bias on the cross-coupled transistor pair base-collector junctions is small enough to avoid saturation of one of the transistors T1 and T2.

Additionally, the offset voltage applied to the clamping transistor T3 can be chosen freely and does not depend on the forward voltage of a Schottky diode. This allows the best compromise between cell noise margin and saturation to be obtained.

Since the temperature co-efficients of the clamping transistor junction voltages are similar the degree of clamping transistor saturation remains constant over the range of operating temperatures. The use of voltage clamping transistor rather than Schottky diodes means that most of the read or write current applied via the column drive inputs CD1 and CD2 is tapped off to ground through the collector of the dual-emitter clamping transistor T3 rather than loading the row select line RD. This results in increased operating speed and/or reduced power in the row select driver circuits (not shown).

Transistor memory cell devices according to the invention are eminently suitable for use in fast bipolar random access memories.

We claim:

1. A transistor memory cell device comprising a pair of cross-coupled transistors constituting storage elements for storing binary information and having column drive emitter inputs to which a relatively high column drive current is arranged to be applied for the selective read or write operation of storage elements of the cell device, in which a constant current source provides a relatively low value hold current to maintain the binary digit information stored in the storage elements in the absence of the column drive current, in which a voltage clamping dual emitter transistor has the emitters thereof connected directly to the respective base-collector interconnections of the pair of cross-coupled transistors, with the base of the clamping transistor having applied to it an offset voltage higher than a voltage applied to a non select line connected to the collector circuits of the cross-coupled transistors whereby the possible forward bias of the cross-coupled transistor pair base-collector junction is small enough to avoid saturation.

* * * * *